(12) United States Patent
Ru et al.

(10) Patent No.: US 11,889,279 B2
(45) Date of Patent: Jan. 30, 2024

(54) FREQUENCY DEPENDENT DYNAMIC RANGE CONTROL

(71) Applicant: Nuvoton Technology Corporation, Taiwan (CN)

(72) Inventors: Powen Ru, San Jose, CA (US); Jin Hee Kim, San Jose, CA (US); Tawei Yang, Fremont, CA (US); Nathan Wong, San Jose, CA (US)

(73) Assignee: Nuvoton Technolog y Corporation, Hsinchu (TW)

( * ) Notice: Subject to any disclaimer, the term of this patent is extended or adjusted under 35 U.S.C. 154(b) by 173 days.

(21) Appl. No.: 17/547,219

(22) Filed: Dec. 9, 2021

(65) Prior Publication Data

US 2023/0188890 A1    Jun. 15, 2023

(51) Int. Cl.
*H04R 3/04* (2006.01)
*H03F 7/04* (2006.01)

(52) U.S. Cl.
CPC ............ *H04R 3/04* (2013.01); *H03F 7/04* (2013.01)

(58) Field of Classification Search
None
See application file for complete search history.

(56) References Cited

U.S. PATENT DOCUMENTS

| | | | |
|---|---|---|---|
| 2016/0277833 A1* | 9/2016 | Qin | H04R 17/005 |
| 2018/0358945 A1* | 12/2018 | Lindemann | H03G 11/00 |
| 2021/0391702 A1* | 12/2021 | Yang | H02H 9/02 |

* cited by examiner

*Primary Examiner* — James K Mooney
(74) *Attorney, Agent, or Firm* — Kilpatrick Townsend & Stockton LLP

(57) ABSTRACT

A frequency dependent dynamic range control method is employed in a signal emitting system characterized by lower impedance in the high frequency region. An efficient technique is implemented to dynamically estimate current spectrum and conditioning parameters to lower the current in the high frequency region. The method advantageously avoids current overloading without using a series resistor as a current limiter.

6 Claims, 11 Drawing Sheets

FREQUENCY DEPENDENT DYNAMIC RANGE CONTROL

BACKGROUND

The present invention relates to signal processing devices, systems, and methods. More specifically, embodiments of the present invention use a frequency dependent dynamic range control technique in a signal emitting system to avoid current overloading. In some embodiments, this technique is applied to a piezo speaker system.

Piezo speakers are characterized by less impedance in high frequency regions, representative of a capacitive load. Therefore, signals at higher frequencies can cause current overloading. Conventional methods of dynamic range control often use a series resistor as a current limiter, which causes signal attenuation at all frequencies.

Therefore, improved methods and systems that address some of the limitations described above are desired.

BRIEF SUMMARY

In embodiments of the invention, a frequency dependent dynamic range control method is employed in a signal emitting system characterized by lower impedance in the high frequency region. An efficient technique is implemented to dynamically estimate current spectrum and conditioning parameters to lower the current in the high frequency region. The method advantageously avoids current overloading without using a series resistor as a current limiter.

Embodiments of the invention provide a signal emitting system that includes a signal emitter, an amplifier, and a processor. The signal emitter is characterized by an admittance that increases with signal frequency and is configured to emit an output signal based upon an amplified signal. The amplifier is coupled to the signal emitter and is configured to receive a dynamically conditioned source signal, generate the amplified signal based upon the dynamically conditioned source signal, and transmit the amplified signal to the signal emitter. The processor is coupled to the amplifier and configured to receive a source signal and to generate the dynamically conditioned source signal to the amplifier. In some embodiments, the processor includes:

a frequency transform block configured to transform the source signal to a reconstructable frequency domain representation, wherein the frequency domain representation comprises a plurality of frequency bins;

a spectrum-to-voltage transfer function block configured to convert the frequency domain representation to a voltage representation, an admittance characteristic block configured to convert the voltage representation to a current spectrum;

a parameter extraction block configured to determine a breakdown frequency bin index and a roll-off factor, wherein the breakdown frequency bin index is the highest frequency bin index where a cumulated current does not exceed a pre-determined current limit, and the roll-off factor is used to exponentially attenuate the frequency domain representation, wherein the roll-off factor is a dynamically determined number ranging from 0 to 1, iteratively determined such that an overall current is under the pre-determined current limit;

a dynamic conditioning filter block configured to construct a conditioning gain vector for the plurality of frequency bins, wherein the conditioning gain vector comprises a flat-band portion of unity gain and a roll-off portion of decaying gain, wherein the flat-band portion comprises frequency bins having bin indices below a flat-band bin index based on the breakdown frequency bin index, and the roll-off portion comprises frequency bins with bin indices above the flat-band bin index, and applies the conditioning gain vector to the frequency domain representation to produce a conditioned frequency domain representation;

an inverse transform block configured to inversely transform the conditioned frequency domain representation to an intermediate time-domain signal; and a post processing block configured to apply gradient control to the intermediate time-domain signal to limit differences between consecutive samples of the intermediate signal to produce the dynamically conditioned signal, and send the dynamically conditioned source signal to the amplifier.

In some embodiments of the above signal emitting system, the parameter extraction block is further configured to use a binary search to iteratively determine the roll-off factor, wherein the gain of the first bin in the roll-off portion is reduced by the roll-off factor, and gains in the remaining bins in the roll-off portion are reduced by exponents of the roll-off factor.

In some embodiments the signal emitter is a piezo speaker and the output signal is an acoustic signal.

In some embodiments, the reconstructable frequency domain representation is selected from the group consisting of fast Fourier transform (FFT), discrete Fourier transform (DFT), modified discrete cosine transform (MDCT), modified discrete sine transform (MDST), constant-Q transform (CQT), and variable-Q transform (VQT) using a filter channel distribution according to equivalent rectangular bandwidths (ERB) or Bark scale.

In some embodiments, the current spectrum is modified by an inflation factor greater than one.

In some embodiments, the post processing block is configured to determine a difference threshold for gradient control based on the characteristics of the source signal and intermediate signal including crest factor and at least one of mean, standard deviation; root-mean-square; maximum magnitude; average magnitude; crest factor; spectral centroid; and spectral spread.

Some embodiments of the invention provide a method that includes providing a frequency domain representation of a source signal, wherein the frequency domain representation comprises a plurality of frequency bins. The method includes dynamically determining a breakdown frequency bin index and a roll-off factor, wherein the breakdown frequency bin index is the highest frequency bin index where a cumulated current is below a current limit, and the roll-off factor defines an exponential attenuation of the frequency domain representation, wherein the roll-off factor is a number ranging from 0 to 1, iteratively determined such that an overall current is under the current limit. The method further includes constructing a conditioning gain vector for the plurality of frequency bins, wherein the conditioning gain vector comprises a flat-band portion of unity gain and a roll-off portion of decaying gain, wherein the flat-band portion comprises frequency bins having bin indices below a flat-band bin index based on the breakdown frequency bin index, and the roll-off portion comprises frequency bins with bin indices above the flat-band bin index. The method also includes applying the conditioning gain vector to the frequency domain representation to produce a conditioned frequency domain representation, such that an overall current is under the current limit.

In some embodiments, the above method also includes receiving the source signal in a time domain; transforming the source signal to the frequency domain representation; converting the frequency domain representation to a voltage representation; converting the voltage representation to a current spectrum; and estimating a current using the current spectrum. In some embodiments, the method further includes inversely transforming the conditioned frequency domain representation to an intermediate time-domain signal; applying gradient control to the intermediate time-domain signal to limit differences between consecutive samples of the intermediate signal to produce a dynamically conditioned signal; and sending the dynamically conditioned signal to an amplifier.

BRIEF DESCRIPTION OF THE DRAWINGS

For a more complete understanding of the disclosure, reference should be made to the following detailed description and accompanying drawings wherein.

DETAILED DESCRIPTION OF THE INVENTION

Aspects of the disclosure are described more fully hereinafter with reference to the accompanying drawings, which form a part hereof, and which show, by way of illustration, example features. The features can, however, be embodied in many different forms and should not be construed as limited to the combinations set forth herein; rather, these combinations are provided so that this disclosure will be thorough and complete, and will convey the scope. Among other things, the features of the disclosure can be facilitated by methods, devices, and/or embodied in articles of commerce. The following detailed description is, therefore, not to be taken in a limiting sense.

Figure 1:
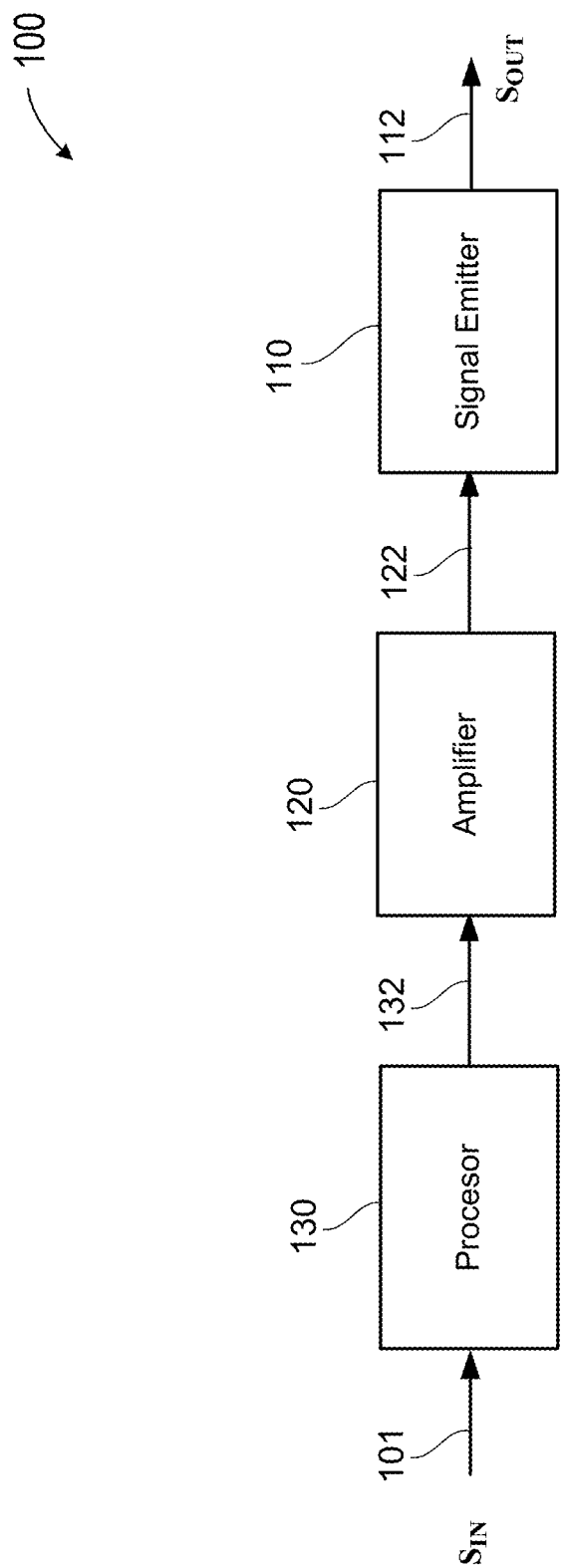
FIG. 1 is a simplified diagram illustrating a signal emitting system 100 according to various embodiments of the invention.

FIG. 1 is a simplified diagram illustrating a signal emitting system 100 according to various embodiments of the invention. As shown in FIG. 1, signal emitting system 100 includes a signal emitter 110, an amplifier 120 coupled to the signal emitter 110, and a processor 130 coupled to the amplifier 120. The signal emitter 110 is configured to emit an output signal 112 ($S_{OUT}$) based upon an amplified signal 122. The amplifier 120 is configured to receive a dynamically conditioned source signal 132, generate the amplified signal 122 based upon the dynamically conditioned source signal 132, and transmit the amplified signal 122 to the signal emitter 110. The processor 130 is coupled to the amplifier 120. The processor 130 is configured to receive a source signal 101 ($S_{IN}$), to process the source signal 131 to generate the dynamically conditioned source signal 132 and to send the dynamically conditioned source signal 132 to the amplifier 120.

In various embodiments, the signal emitter 100 can be any system that emits a signal. For example, in some embodiments, the signal emitter 100 is an audio speaker, a headset, or an acoustic signal transmitter, etc. In some embodiments, the signal emitter 100 is an antenna that emits an electromagnetic signal. For example, the signal emitter 100 can be a radio signal transmitter, or an optical signal transmitter, etc.

In various embodiments, the amplifier 120 is an electronic amplifier circuit that amplifies a signal or increases the power of the signal, where the signal is usually a time-varying voltage or current. Examples of amplifier 120 include audio amplifiers, radio frequency (RF) amplifiers, operational amplifiers, and switched-mode amplifiers, etc. The amplifier 120 can be implemented in CMOS or bipolar circuits. The output of the amplifier 120 is prepared in suitable forms for the signal emitter 110. For example, the signal emitter 100 can include signal transducers or converters that convert the source signal to analog or digital electrical signals that can be processed by the signal emitter 110. For example, the signal emitter 100 can include analog-to-digital converter (ADC) and digital-to-analog (DAC), etc.

Depending on the embodiments, the processor 130 can be any signal processing devices. For example, the processor 130 can include analog filter circuits, general-purpose digital computers, or digital signal processors (DSPs), etc. For a given processor 130, the source signal 132 is prepared in suitable forms for the processor. For example, the signal emitter 100 can include signal transducers or converters that convert the source signal to analog or digital electrical signals that can be processed by the processor 130. For example, the signal emitter 100 can include an analog-to-digital converter (ADC) and a digital-to-analog converter (DAC), etc. Further details of the signal emitter 100 are described below using an audio system 200 as an example.

Figure 2:
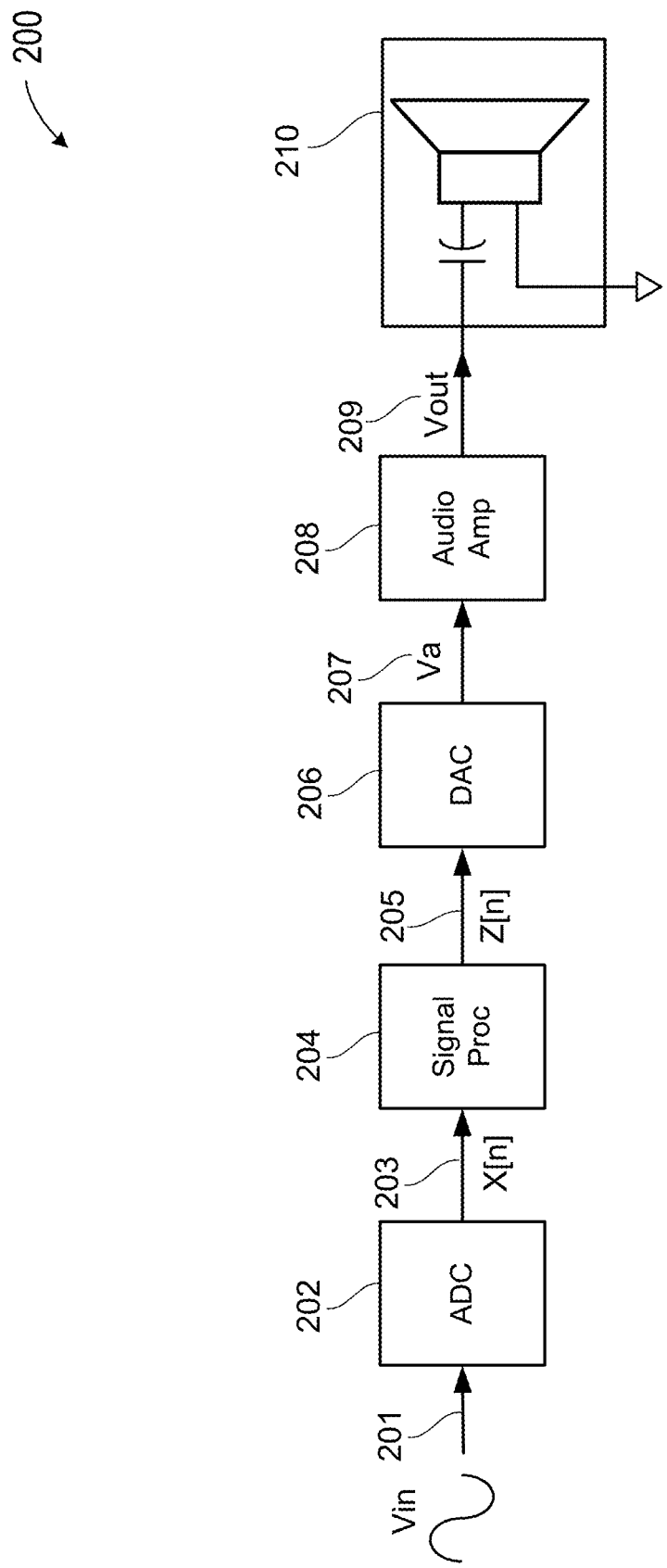
FIG. 2 is a simplified block diagram illustrating an audio system 200 according to various embodiments of the invention.

FIG. 2 is a simplified block diagram illustrating an audio system 200 according to various embodiments of the invention. As shown in FIG. 2, audio system 200 is configured to receive an audio input signal Vin 201 and to provide an audio output signal Vout 209 to a speaker 210. Audio system 200 includes an analog-to-digital converter (ADC) 202, a digital signal processing unit 204, a digital-to-analog converter (DAC) 206, and an audio amplifier unit 208. The output from the ADC 202 is a digital signal 203 that feeds into signal processor 204, which produces a processed digital signal 205 to the DAC 206. The output from the DAC 206 is an analog signal Va 207 that feeds into audio amplifier 208, which provides audio output signal Vout 209 to speaker 210. The functions of these components are not explained in detail here.

In audio system 200, the digital signal processing unit 204 is an example of the processor 130 in the signal emitting system 100 of FIG. 1, the audio amplifier 206 is an example of the amplifier 120 in the signal emitting system 100 of FIG. 1, and speaker 210 an example of the signal emitter 110 in the signal emitting system 100 of FIG. 1. The input signal 203 to the digital signal processor 204 corresponds to source signal 131 ($S_{IN}$) in the signal emitting system 100 of FIG. 1. The output signal 205 from the digital signal processor 204 is a digital signal, also designated as z[n], where n is an integer.

Figure 3:
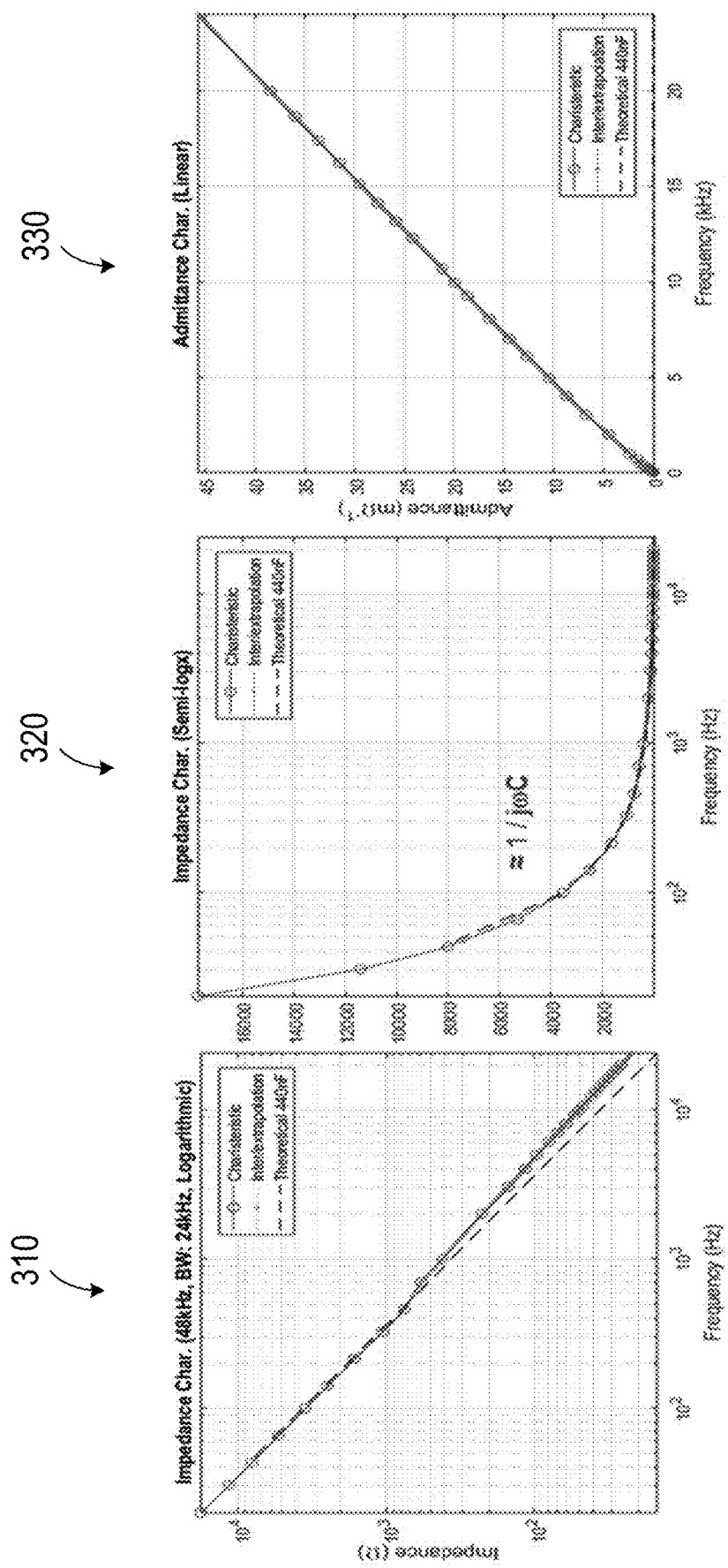
FIG. 3 illustrates impedance vs. frequency plots for a representative piezo speaker, which is characterized by lower impedance with increasing signal frequency.

In some embodiments, audio system 200 is a piezo speaker system, in which speaker 210 is a piezo speaker. FIG. 3 illustrates impedance vs. frequency plots for a representative piezo speaker, which is characterized by lower impedance with increasing signal frequency. In FIG. 3, plot 310 is a log-log plot, plot 320 is a linear-log plot, and plot 330 is a linear-linear plot. In all three plots, the circles represent measured characteristics, the dotted line is the interpolation/extrapolation curve, and the dashed line shows a theoretical impedance vs. frequency curve for a capacitor with a capacitance of 440 nf. All three plots show that the impedance of the piezo speaker decreases with increasing frequency, representative of a capacitive load device.

Figure 4:
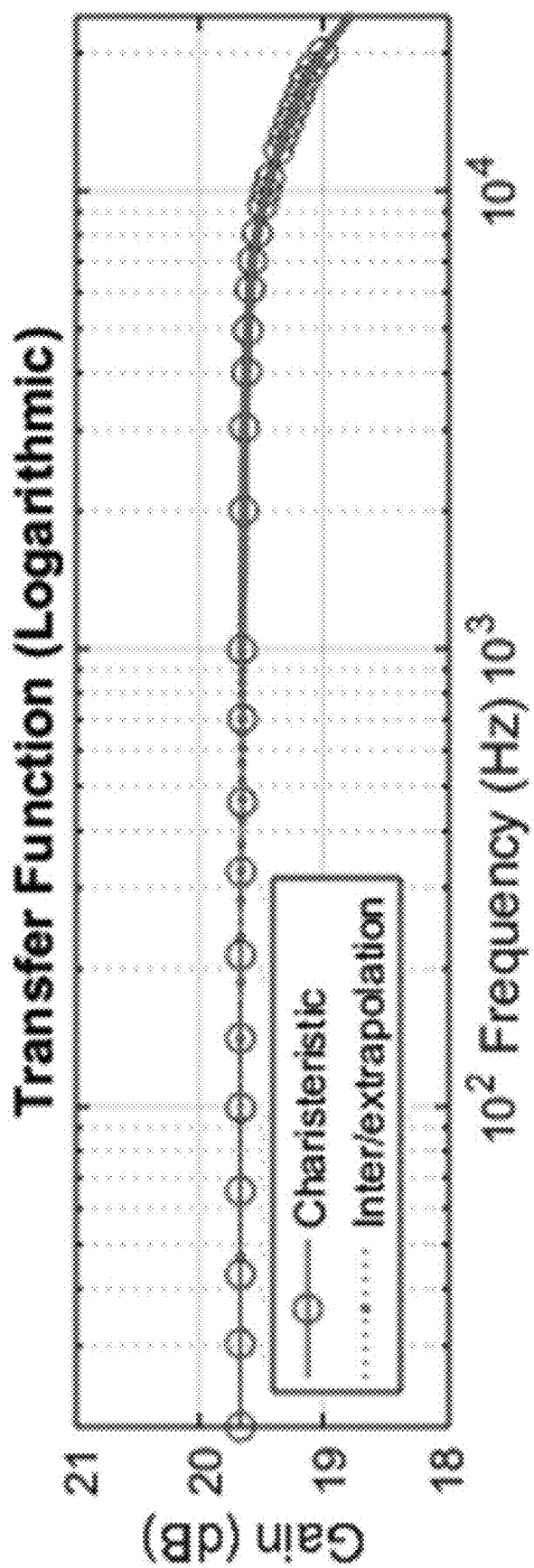
FIG. 4 illustrates a plot of transfer function for an example amplifier.

FIG. 4 illustrates a plot of transfer function for an example amplifier. It can be seen that the speaker system does not have a flat transfer function, and the gain drops off at higher frequencies. FIG. 4 may be a representative transfer function for a class-D amplifier.

Piezo speakers are known to suffer from high current overload due to low impedance in high frequency region. A maximum current limit is usually listed in the specification and a breakdown may happen when the current exceeds the maximum current limit imit.

Figure 5A:
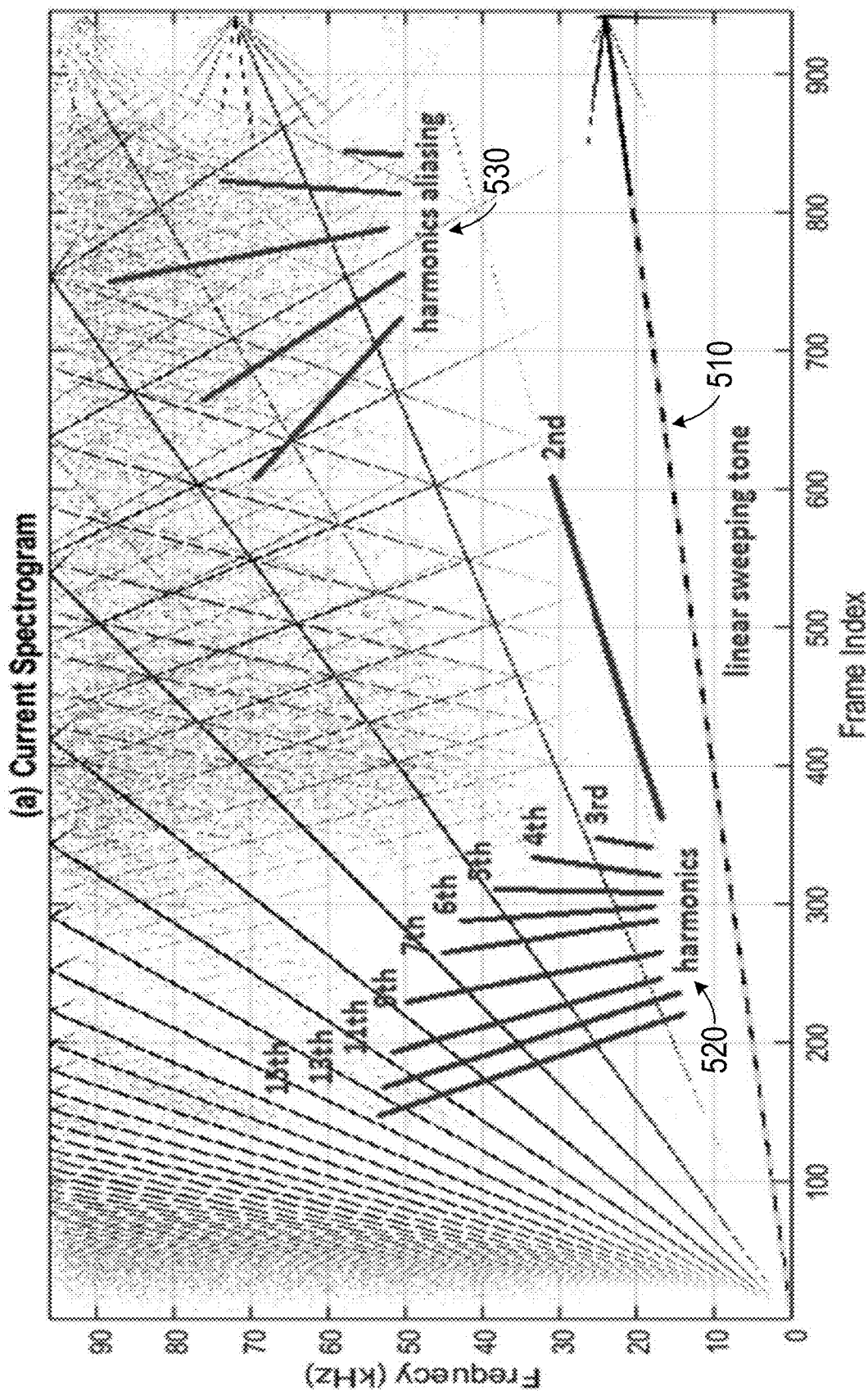
FIG. 5A illustrates a current spectrogram for a piezo speaker.
Figure 5B:
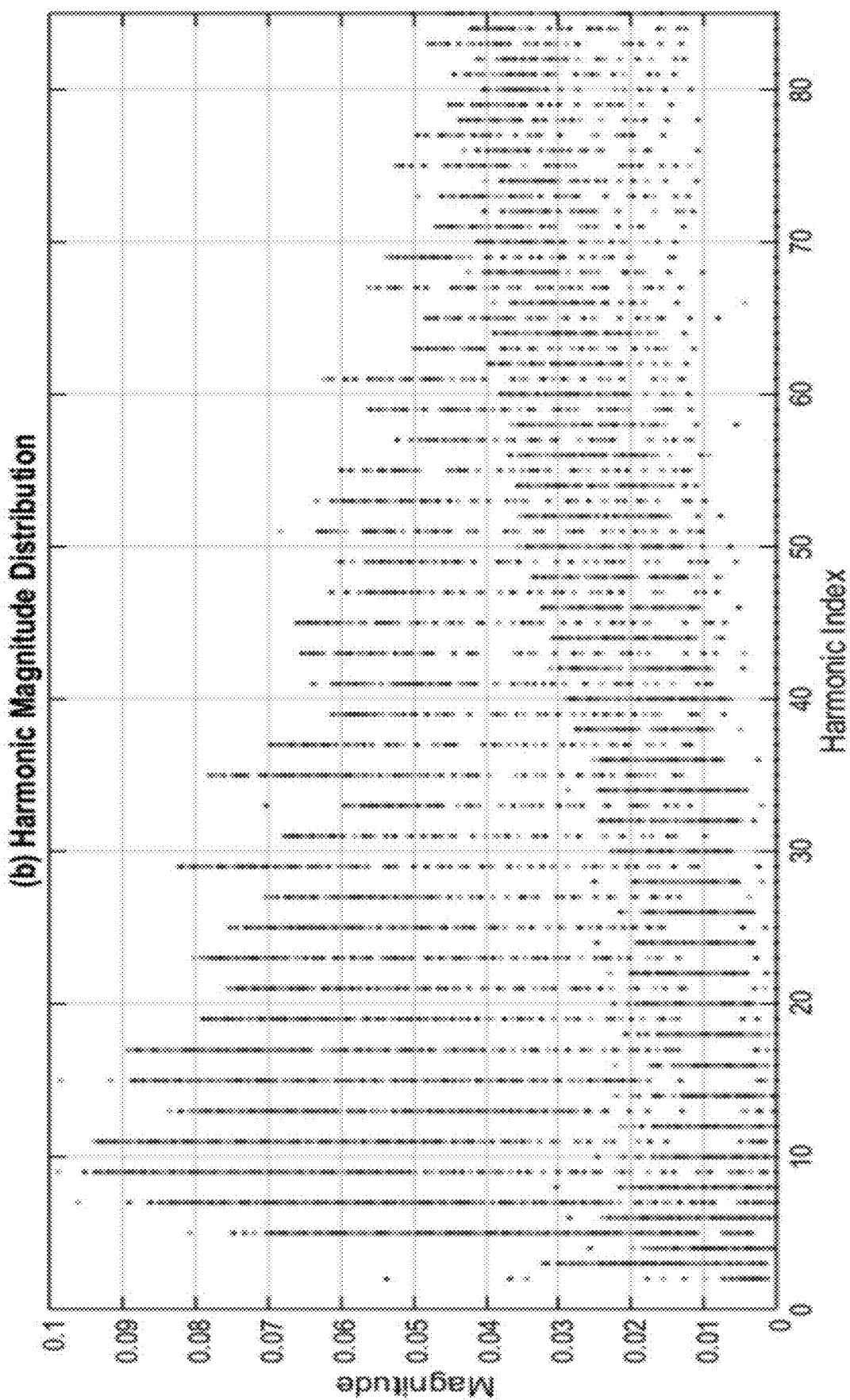
FIG. 5B illustrates a harmonic magnitude distribution for a piezo speaker.

Furthermore, speaker systems may have nonlinear characteristics due to harmonic distortion, as illustrated in FIG. 5A and FIG. 5B. FIG. 5A illustrates a current spectrogram for a piezo speaker. In FIG. 5A, the horizontal axis is the frame index, and the vertical axis is the frequency. The harmonics and harmonics aliasing are shown, along with the linear sweeping tone. FIG. 5B illustrates a harmonic magnitude distribution for a piezo speaker. In FIG. 5B, the horizontal axis is the frame index, and the vertical axis is the magnitude. The imperfections described above prevent reliable current estimate and make it difficult to implement dynamic range control.

One conventional way to limit the current in a piezo speaker system is to cascade the piezo speaker with a series resistor. However, this approach adversely reduces the gain in the high frequency region even when the content does not trigger current overload and thus results in permanent attenuation of high frequency content. Therefore, it would be desirable to modify the content only when it is necessary to keep the current under the current limit and maintain a smooth perception.

Figure 6:
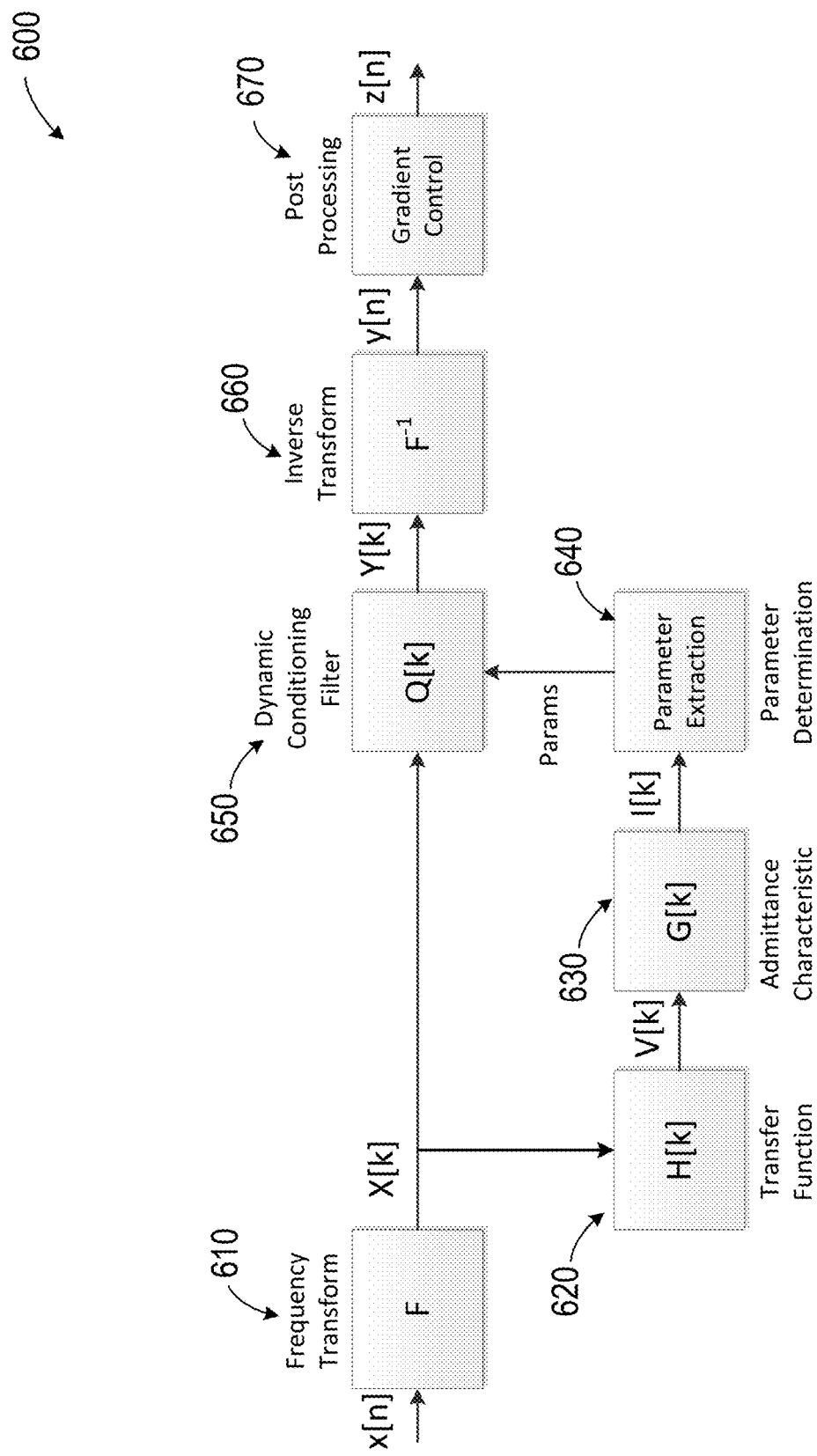
FIG. 6 is a simplified block diagram illustrating a processor 600 according to some embodiments of the invention.

FIG. 6 is a simplified block diagram illustrating a processor 600 according to some embodiments of the invention. Process 600 is an example of a processor that can be used as processor 130 in signal emitting system 100 of FIG. 1 or digital signal processing unit 204 in audio system 200 of FIG. 2. In both signal emitting system 100 of FIG. 1 and audio system 200 of FIG. 2, the load device is characterized by an impedance that decreases with increasing frequency, representative of a capacitive load device. Put another way, the load device is characterized by an admittance that increases with signal frequency. An example of such a load device includes the piezo speaker.

In the embodiment in FIG. 6, processor 600 includes a frequency transform block 610, a transfer function block 620, an admittance characteristic block 630, a parameter extraction block 640, a dynamic conditioning filter block 650, an inverse transform block 660, and a post processing block 670. In some embodiments, the processor 600 is configured to receive a source signal x[n], to process the source signal x[n], and to generate the dynamically conditioned source signal z[n], where n is an integer.

In some embodiments, the processor (e.g., 130 in FIGS. 1 and 600 in FIG. 6) is coupled to the amplifier (e.g., 120 in FIG. 1 or 208 in FIG. 2) and configured to receive a source signal x[n] and to generate the dynamically conditioned source signal z[n] to the amplifier 120. In some embodiments, the processor includes a frequency transform block 610 configured to transform the source signal x[n] to a reconstructable frequency domain representation X[k], wherein the frequency domain representation comprises a plurality of frequency bins, a spectrum-to-voltage transfer function block 620 configured to convert the frequency domain representation X[k] to a voltage representation V[k], and an admittance characteristic block G[k] configured to convert the voltage representation V[k] to a current spectrum (I[k]). As an example, an acoustic signal with a bandwidth of 24K may be divided into 512 bins.

In some embodiments, the reconstructable frequency domain representation is selected from the group consisting of fast Fourier transform (FFT), discrete Fourier transform (DFT), modified discrete cosine transform (MDCT), modified discrete sine transform (MDST), constant-Q transform (CQT), and variable-Q transform (VQT) using a filter channel distribution according to equivalent rectangular bandwidths (ERB) or Bark scale.

The processor 600 also includes a parameter extraction block 640 configured to determine a breakdown frequency bin index $k_b$ and a roll-off factor r, wherein the breakdown frequency bin index $k_b$ is the highest frequency bin index where a cumulated current does not exceed a pre-determined current limit, and the roll-off factor r is used to exponentially attenuate ($r^n$) the frequency domain representation, wherein the roll-off factor is a dynamically determined number ranging from 0 to 1, iteratively determined such that an overall current is the pre-determined current limit. For example, in the embodiments, the roll-off factor r is selected such that the overall current is equal to or less than 95% and more than 90% of the current limit.

The processor 600 also includes a dynamic conditioning filter block 650 configured to construct a conditioning gain vector Q[k] for the plurality of frequency bins, wherein the conditioning gain vector comprises a flat-band portion of unity gain and a roll-off portion of decaying gain. An example of the flat-band portion and the roll-off portion is shown in FIGS. 7A and 7B.

Figure 7A:
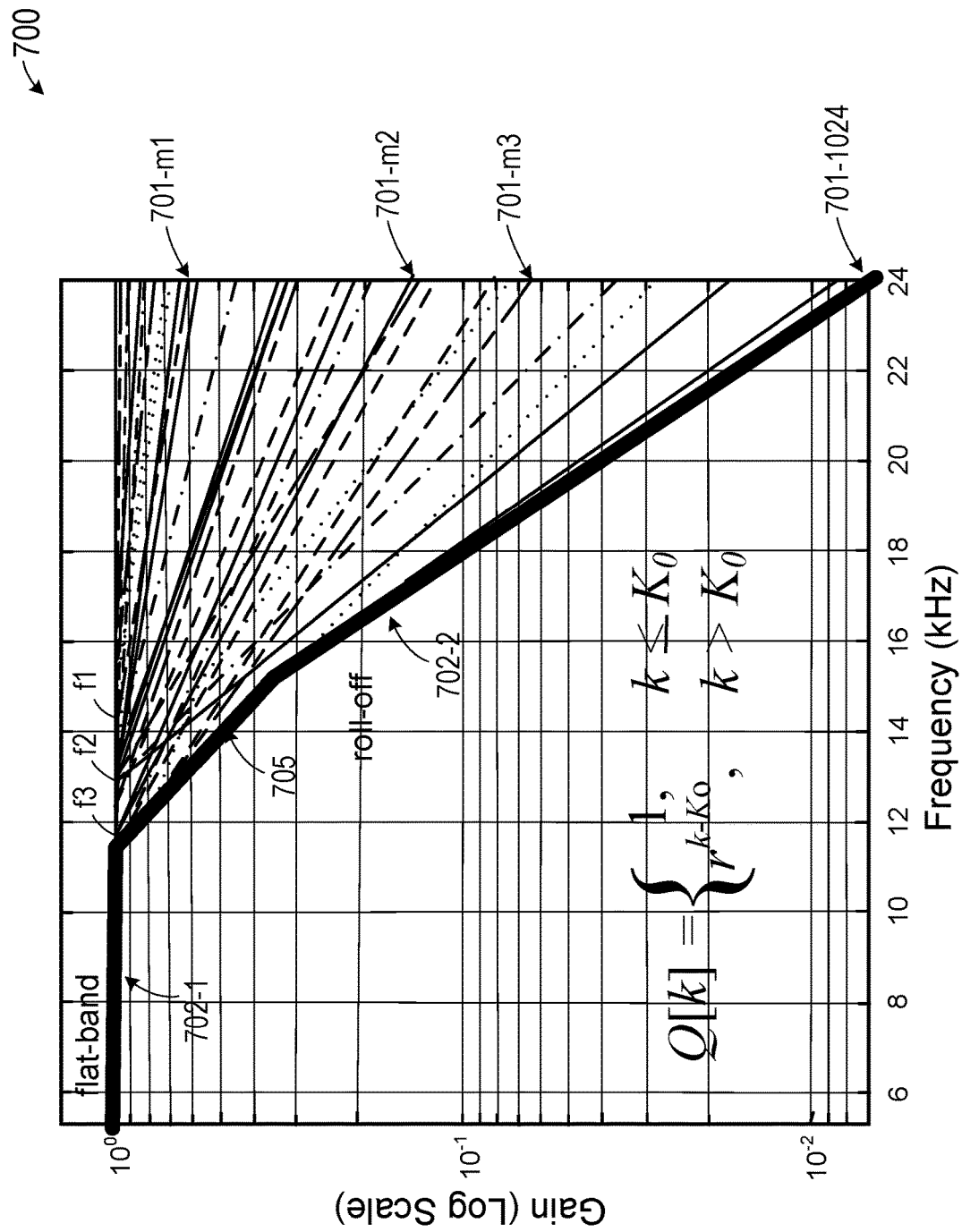
FIG. 7A is a transfer function plot of gain versus frequency in log-linear scales according to various embodiments of the invention.
Figure 7B:
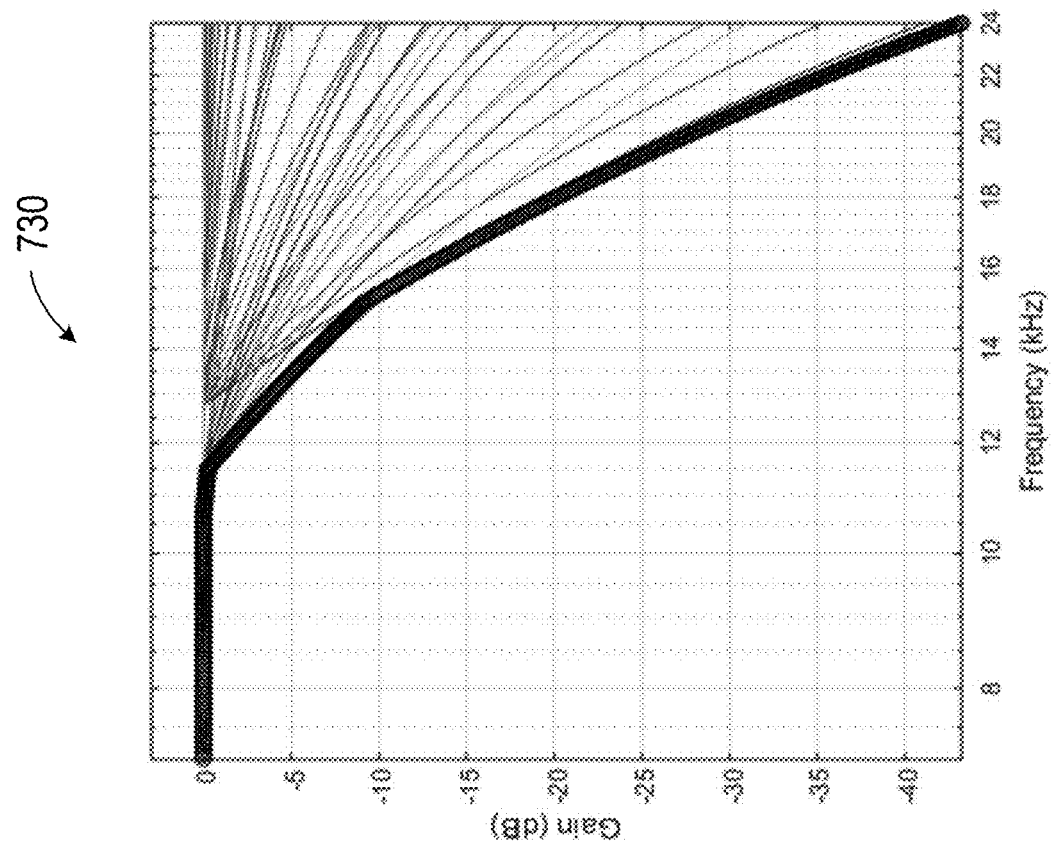
FIG. 7B shows transfer function plots of gain versus frequency in linear-linear scales and logarithm decibel scales, respectively, according to various embodiments of the invention.
Figure 7B:
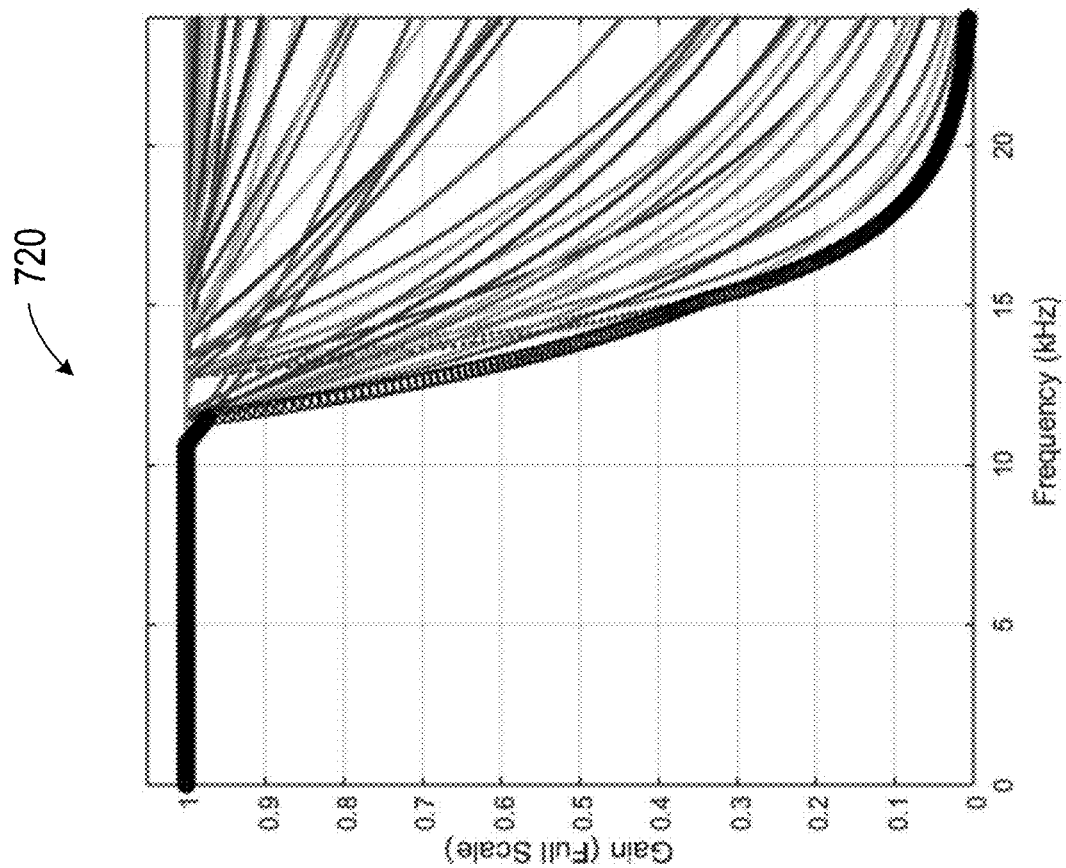

FIG. 7A is a transfer function plot 700 of gain versus frequency in log-linear scales according to various embodiments of the invention. As shown in FIG. 7A, the flat-band portion 702-1 comprises frequency bins having bin indices below a flat-band bin index (f1, f2, or f3) based on the breakdown frequency bin index, and the roll-off portion 702-2 comprises frequency bins with bin indices above the flat-band bin index. The dynamic conditioning filter block 650 is also configured to apply the conditioning gain vector Q[k] to the frequency domain representation to produce a conditioned frequency domain representation Y[k]. FIG. 7B shows transfer function plots of gain versus frequency in linear-linear scales (720) and logarithm decibel scales (730).

The processor 600 also includes an inverse transform block 660 configured to inversely transform ($F^{-1}$) the conditioned frequency domain representation Y[k] to an intermediate time-domain signal y[n]. In some embodiments, the processor 600 also includes a post processing block 670 configured to apply gradient control to the intermediate time-domain signal y[n] to limit the difference between consecutive samples of the intermediate time-domain signal y[n] to produce the dynamically conditioned signal (z[n]), and send the dynamically conditioned source signal to the amplifier (e.g., 120 in FIG. 1 or 208 in FIG. 2). Further details of the processor 600 are described below.

In some embodiments, a channel of digitally sampled signals s[n; m] (e.g., at 48 kHz) is on a frame-basis (e.g., 512 samples, i.e., 10.6667 ms), where m is the index of a frame. A windowing function w[n] (e.g., Hanning window, 1024 points) is employed to modulate the framed signal and its memory (e.g., the previous frame) to generate a windowed signal x[n; m].

$$x[n;m]=w[n]s[n;m] \quad (1)$$

For simplicity, FIG. 6 is illustrated with reference to a single signal frame, and the index of frame "m" is omitted. For example, in FIG. 6, signal x[n; m] is shown as x[n]. Similarly, signals X[k; m], V[k; m], I[k; m], Y[k; m], y[n; m], and z[n; m] are shown in FIG. 6 as X[k], V[k], I[k], Y[k], y[m], and z[n].

In the frequency transform block 610, the windowed signal x[n; m] is converted to its frequency representation X[k; m] (k=1 . . . 1024) via a transform function, such as Fourier transform (e.g., FFT).

$$x[n;m] \xrightarrow{F} X[k;m] \quad (2)$$

The frequency representation can be characterized by its first K/2+1 values (i.e., bins in some context). In some embodiments, this transform operation is carried out for the first K/2+1 values.

In the transfer function block 620, a spectrum-to-voltage transfer function H[k] converts the frequency representation to a voltage spectrum V[k; m].

$$V[k;m]=H[k]X[k;m] \quad (3)$$

An example of spectrum-to-voltage transfer function H[k] is shown in FIG. 4. The spectrum-to-voltage transfer function H[k] defines the mapping between the frequency representation and the voltage spectrum.

In the admittance characteristic block 630, an admittance function G[k] (e.g., FIG. 2) converts the voltage spectrum to a current spectrum I[k; m].

$$I[k;m]=G[k]V[k;m] \quad (4)$$

An example of admittance function G[k] is shown in FIG. 3. The admittance function G[k] (330 in FIG. 3) can be directly derived from the impedance function (310 or 320 in FIG. 3).

In the parameter extraction block 640, the total current of the channel is determined. It is determined whether the total current of any channel exceeds a predetermined current limit $I_{lmt}$. For example, the predetermined current limit can be the maximum current limit listed in the specification of the signal emitter, such as a piezo speaker. If the total current of any channel exceeds a predetermined current limit $I_{lmt}$, two parameters for a dynamic conditioning filter function Q[k; m] are determined. In some embodiments, the roll-off factor is an exponential function to reduce the signal at high frequencies to avoid breakdown. The dynamic conditioning filter function Q[k; m] is described in more detail below with reference to FIGS. 7A and 7B.

In the dynamic conditioning filter block 650, the dynamic conditioning filter function Q[k; m] is applied to dynamically attenuate part of the frequency representation so as to keep the total current under control. The dynamic conditioning filter function Q[k; m] is applied to modify the frequency representation to generate an attenuated frequency representation Y[k; m] such that the total current is under the predetermined current limit $I_{lmt}$.

$$Y[k;m]=Q[k;m]X[k;m] \quad (5)$$

Still referring to FIG. 6, in the inverse transform block 660, the attenuated frequency representation Y[k; m] is then converted back to an intermediate time-domain signal y[n; m] via inverse Fourier transform (e.g., IFFT).

$$Y[k;m] \xrightarrow{F^{-1}} y[n;m] \quad (6)$$

Next, in the post processing block 670, a dynamically conditioned signal z[n; m] can be synthesized from the intermediate time-domain signal via an overlap-and-add method followed by a gradient control, to be described below.

The current spectrum may be advantageously scaled by an inflation factor (>1). FIG. 5A shows the spectrogram of the output current of a linearly sweeping tone 510 from 50 to 24 k Hz. A light dashed line 510 highlights the fundamental frequency of the sweeping tone. The nonlinearity of the system yields the harmonics 520 as indicated. The traces intercepting the harmonics are the aliasing images 530 of the harmonics beyond the Nyquist frequency (i.e., half of the sample rate) of the measuring device. All of the harmonics and the aliasing energy are considered in total current. Per observation, the harmonics of different fundamental frequencies exhibit similar behaviors. FIG. 5B shows the distribution of relative harmonic magnitude (i.e., normalized by the magnitude of the fundamental). One can see the odd harmonics (characterized by an odd harmonic index) standing out. The even harmonics (characterized by an even harmonic index) are more likely to be the aliasing images of the odd harmonics beyond the Nyquist frequency. The inflation factor can be determined from the root-mean-square of the maximum harmonic magnitude among the collected harmonic magnitudes.

In the dynamic conditioning filter block 650, the filter function Q[k; m] dynamically attenuates part of the frequency representation so as to keep the total current under control. When the estimated current exceeds the current limit, the single-sideband (K/2+1 bins) is split to two bands: a flat band consisting of the first $K_0$ bins and an attenuation band consisting of the remaining $K_1$ (i.e., K/2+1−$K_0$) bins. The values of the bins in the flat band are all ones, and the values of the bins in the roll-off band are less than one, preferably decreasing monotonically as the frequency goes higher. The value of the first remaining bin can be defined by a roll-off factor r, the value of the 2nd remaining bin can be $r^2$, . . . , the value of the i-th remaining bin can be $r^i$.

$$Q[k;m] = \begin{cases} 1, & k \le K_0 \\ r^{k-K_0}, & k > K_0 \end{cases} \quad (7)$$

In the parameter extraction block 640, a breakdown frequency bin index $k_b$ and a roll-off factor r are determined. As the total current is calculated in root-mean-square (rms) fashion, it is more convenient to use sum-square to check whether the cumulated current exceeds the current limit.

$$S_{lmt} = I_{lmt}^2 \qquad (8)$$

In order to properly define the number $K_0$, a cumulated square current S[k] is calculated from the first bin.

$$S[k] = \Sigma_{i=1}^{k} I[i]^2 \qquad (8)$$

where I[i] is the current for the i-th component in the first bin.

A breakdown frequency bin index $k_b$ is determined based on where the cumulated current just exceeds the current limit for the first time. Put another way, the breakdown frequency bin index is the highest frequency bin index where a cumulated current does not exceed a current limit.

$$k_b = \max \arg S[k] < S_{lmt} \qquad (9)$$

A flat-band factor b (e.g., 0.8) is applied to breakdown frequency bin index $k_b$ to get the number of flat-band bins.

$$K_b = b k_b \qquad (10)$$

The roll-off factor r is then selected to control the current $$S_{flat} = S[K_0] = \Sigma_{i=1}^{K_0} I[i]^2 \qquad (11)$$

$$S_{roll} = \Sigma_{i=1}^{K_1} r^{2i} I[i+K_0]^2 \qquad (12)$$

$$S_{flat} + S_{roll} < S_{lmt} \qquad (13)$$

$$S_{roll} < S_{lmt} - S_{flat} = S_{thr} \qquad (14)$$

$$\Sigma_{i=1}^{K_1} r^{2i} I[i+K_0]^2 < S_{thr} \qquad (15)$$

where $S_{lmt}$ represents the current limit, and $S_{thr}$ represents a threshold current limit for the roll-off portion.

Let $s = r^2$, $0 < s < 1$, to simplify the problem to a more mathematically tractable polynomial, $$\Sigma_{i=1}^{K_1} I[i+K_0]^2 s^i < S_{thr} \qquad (16)$$

Given $I[i+K_0]^2$ as the known coefficients, the left-hand-side term can be efficiently evaluated via MAC (Multiply/ACcumulate) operations. A binary search or gradient search is carried out in the range between 0 and 1 to narrow down the range of s. Next, the roll-off factor r can be determined as follows.

$$r = \sqrt{s} \qquad (17)$$

As described above, setting two parameters $K_0$ and r are enough to keep current under limit. In some embodiments, adapting the parameters once the trigger condition is gone is rather desirable to ease perceptual disruption. An adapting (or forgetting) factor α and β is advantageously applied for each parameter.

$$K_0^{[m]} = \begin{cases} K_0, & K_0 < K_0^{[m-1]} \\ (1-\alpha)K_0^{[m-1]} + \alpha K_0, & K_0 \geq K_0^{[m-1]} \end{cases} \qquad (18)$$

$$r^{[m]} = \begin{cases} r, & r < r^{[m-1]} \\ (1-\beta)r^{[m-1]} + \beta r, & r \geq r^{[m-1]} \end{cases} \qquad (19)$$

where m is the frame index.

FIG. 7A depicts the dynamically determined transfer functions (Q[k]) for a particular test vector according to some embodiments of the invention. In FIG. 7A, the horizontal axis is the frequency in kHz in a linear scale, and the vertical axis is the gain in a logarithmic scale. FIG. 7A shows a transfer function for each frame of the test vector. For example, transfer functions 701-*m*1, 701-*m*2, and 701-*m*3 illustrate transfer functions for frame index numbers m1, m2, and m3 for a signal having multiple frames of audio signal. The transfer functions are dynamically determined for each frame of signal, and frame index numbers m1, m2, and m3 do not necessarily represent a sequential order of frames.

Each transfer function (701) is composed of two portions: a first portion 702-1 represented by a constant gain and a second portion 702-2 represented by a roll-off gain function. In some embodiments, the first portion 702-1 is a flat-band portion of unity gain and the second portion 702-2 is a roll-off portion of decaying gain. In the log-linear plot of FIG. 7A, both the first portion 702-1 and the second portion 702-2 are shown as straight lines, the first portion 702-1 being flat and the second portion 702-2 sloping down. Depending on the frequency spectrum of each frame, the slope for each frame and the transition frequency $K_0$ for each frame can be different. For example, the transition frequencies f1, f2, and f3 are shown for frame index numbers m1, m2, and m3, respectively.

As shown in FIG. 7A, the lower bound of all the transfer functions is shown as the thick dark line 705, which represent the minimum gain of each frequency bin for all the frames. Without dynamically determining the width of the flat band (determined by the transition frequency) and the slope of the roll-off band, a fixed filter with a transfer function represented by 705 can be applied to avoid current breakdown. On the other hand, the dynamically determined conditional filter is determined for each frame. The dynamic approach advantageously preserves high frequency content at allowable gains while keeping current in control.

In the post processing block 670, a gradient control is added to examine/condition the difference (delta) between samples to prevent short-term current surge. For each sample, the difference d[n] between consecutive samples is first calculated. If the difference is greater than a threshold $d_{thr}$, the difference will be limited to the threshold; in other words, the next sample z[n] is set to the previous sample y[n−1] plus or minus the threshold $d_{thr}$. On the other hand, if the difference is not greater than threshold $d_{thr}$, the next sample y[n] is used as the final conditioned sample.

$$d[n] = y[n] - y[n-1] \qquad (20)$$

$$z[n] = \begin{cases} y[n-1] + \text{sgn}(d[n]) \cdot d_{thr}, & |d[n]| > d_{thr} \\ y[n], & |d[n]| \leq d_{thr} \end{cases} \qquad (21)$$

In some embodiments, the threshold $d_{thr}$ can be a constant for a system. However, it may adversely apply too much limitation which results in unnecessary distortion. In some embodiments, the threshold can be determined based on the characteristics of the source signal and/or the conditioned source signal, including mean, standard deviation, root-mean-square, maximum magnitude, average magnitude, crest factor, spectral centroid, and spectral spread, etc.

Figure 8:
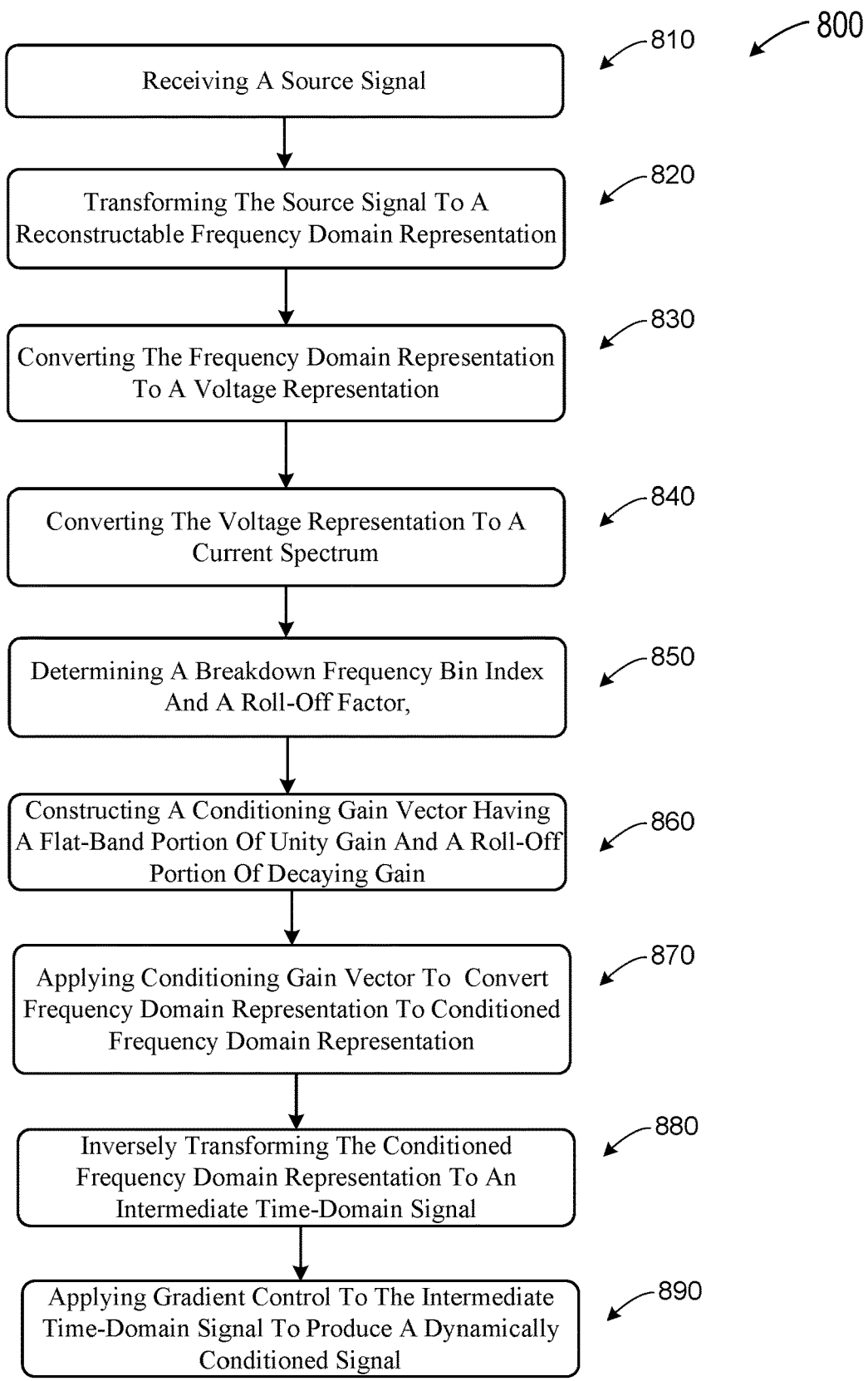
FIG. 8 is a simplified flowchart illustrating a method for signal processing according to various embodiments of the invention.

FIG. 8 is a simplified flowchart illustrating a method for signal processing according to various embodiments of the invention. In FIG. 8, the method 800 is shown in the following processes.

Process 810—receiving a source signal;

Process 820—transforming the source signal to a reconstructable frequency domain representation, wherein the frequency domain representation comprises a plurality of frequency bins;

Process 830—converting the frequency domain representation to a voltage representation;

Process 840—converting the voltage representation to a current spectrum;

Process 850—determining a breakdown frequency bin index and a roll-off factor, wherein the breakdown frequency bin index is the highest frequency bin index where a cumulated current does not exceed a current limit, and the roll-off factor is used to exponentially attenuate the frequency domain representation, wherein the roll-off factor is a dynamically determined number ranging from 0 to 1, iteratively determined such that an overall current is under the current limit;

Process 860—constructing a conditioning gain vector for the plurality of frequency bins, wherein the conditioning gain vector comprises a flat-band portion of unity gain and a roll-off portion of decaying gain, wherein the flat-band portion comprises frequency bins having bin indices below a flat-band bin index based on the breakdown frequency bin index, and the roll-off portion comprises frequency bins with bin indices above the flat-band bin index; and Process 870—applying the conditioning gain vector to the frequency domain representation to produce a conditioned frequency domain representation;

Process 880—inversely transforming the conditioned frequency domain representation to an intermediate time-domain signal; and Process 890—applying gradient control to the intermediate time-domain signal to limit differences between consecutive samples of the intermediate signal to produce a dynamically conditioned signal.

In some embodiments, the method 800 also includes sending the dynamically conditioned source signal to an amplifier.

In some embodiments, the method also includes using a binary search to iteratively determine the roll-off factor, wherein the gain of the first bin in the roll-off portion is reduced by the roll-off factor, and gains in the remaining bins in the roll-off portion are reduced by exponents of the roll-off factor.

In some embodiments, the method is configured to generate the dynamically conditioned source signal for a signal emitter characterized by an admittance that increases with signal frequency.

In some embodiments, the method is configured to generate the dynamically conditioned source signal for a piezo speaker to produce an acoustic output.

In some embodiments, where the reconstructable frequency domain representation is selected from the group consisting of fast Fourier transform (FFT), discrete Fourier transform (DFT), modified discrete cosine transform (MDCT), modified discrete sine transform (MDST), constant-Q transform (CQT), and variable-Q transform (VQT) using a filter channel distribution according to equivalent rectangular bandwidths (ERB) or Bark scale.

In some embodiments, the method also includes modifying the current spectrum by an inflation factor greater than one.

In some embodiments, the method also includes determining a difference threshold for gradient control based on the characteristics of the source signal and intermediate signal including crest factor and at least one of mean, standard deviation; root-mean-square; maximum magnitude; average magnitude; crest factor; spectral centroid; and spectral spread.

In some embodiments, the method 800 summarized above is executed by signal processing system 600 implemented in signal emitting systems 100 and 200 described above with reference to FIGS. 1-7B.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes. The methods and processes disclosed herein may be embodied using a combination of code, data, and hardware modules or apparatuses.

According to some embodiments, the techniques described herein are implemented by one or more special-purpose computing devices or general-purpose computers. The special-purpose computing devices may be hard-wired to perform the techniques, or may include digital electronic devices such as one or more application-specific integrated circuits (ASICs) or field programmable gate arrays (FPGAs) that are persistently programmed to perform the techniques, or may include one or more general purpose hardware processors programmed to perform the techniques pursuant to program instructions in firmware, memory, other storage, or a combination. Such special-purpose computing devices may also combine custom hard-wired logic, analog or mixed signal circuits, ASICs, or FPGAs with custom programming to accomplish the techniques. The special-purpose computing devices may be desktop computer systems, portable computer systems, handheld devices, networking devices or any other device that incorporates hard-wired and/or program logic to implement the techniques.

Figure 9:
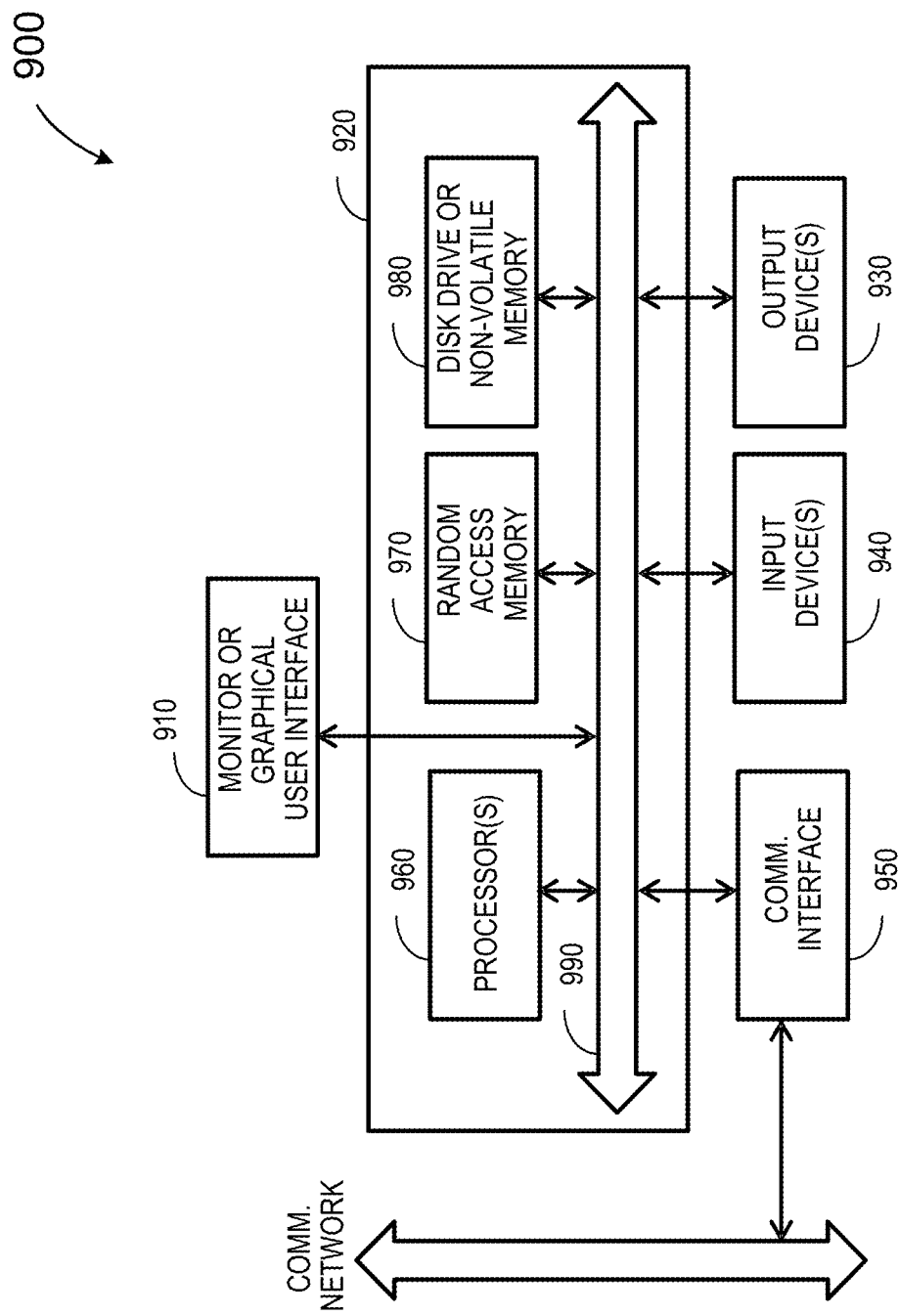
FIG. 9 is a simplified block diagram illustrating an apparatus that may be used to implement various embodiments, according the present invention.

FIG. 9 is a simplified block diagram illustrating an apparatus that may be used to implement various embodiments, according to the present invention. FIG. 9 is merely illustrative of an embodiment incorporating the present disclosure and does not limit the scope of the disclosure as recited in the claims. One of ordinary skill in the art would recognize other variations, modifications, and alternatives. In one embodiment, computer system 900 typically includes a monitor 910, a computer 920, user output devices 930, user input devices 940, communications interface 950, and the like.

FIG. 9 is representative of a computer system capable of embodying the present disclosure. For example, processors 130 in FIG. 1, 204 in FIG. 2, and 600 in FIG. 6 can be implemented using a system similar to system 900 depicted in FIG. 9. The functions of the processors can be carried out by one or more processors depicted in FIG. 9. The amplifiers 120 and 208, ADC 202, and DAC 206 can be implemented using standard analog and mixed-signal techniques. The signal emitter 110, including speaker 210, are generally provided by respective device suppliers.

As shown in FIG. 9, computer 920 may include processor(s) 960 that communicate with a number of peripheral devices via a bus subsystem 990. These peripheral devices may include user output devices 1330, user input devices 940, communications interface 950, and a storage subsystem, such as random-access memory (RAM) 970 and disk drive 980.

User input devices 940 can include all possible types of devices and mechanisms for inputting information to computer system 920. These may include a keyboard; a keypad; a touch screen incorporated into the display; audio input devices, such as voice recognition systems; microphones; and other types of input devices. In various embodiments, user input devices 940 are typically embodied as a computer mouse, a trackball, a track pad, a joystick, a wireless remote, a drawing tablet, a voice command system, an eye tracking system, and the like. User input devices 940 typically allow a user to select objects, icons, text, and the like that appear on the monitor 910 via a command, such as a click of a button or the like.

User output devices 930 include all possible types of devices and mechanisms for outputting information from computer 920. These may include a display (e.g., monitor 910), non-visual displays such as audio output devices, etc.

Communications interface 950 provides an interface to other communication networks and devices. Communications interface 950 may serve as an interface for receiving data from and transmitting data to other systems. Embodiments of communications interface 950 typically include an Ethernet card, a modem (telephone, satellite, cable, ISDN), an (asynchronous) digital subscriber line (DSL) unit, Fire-Wire interface, USB interface, and the like. For example, communications interface 950 may be coupled to a computer network, to a FireWire bus, or the like. In other embodiments, communications interfaces 950 may be physically integrated on the motherboard of computer 920, and may be a software program, such as soft DSL, or the like.

In various embodiments, computer system 900 may also include software that enables communications over a network such as the Hypertext Transfer Protocol (HTTP), the Transmission Control Protocol and the Internet Protocol (TCP/IP), the Real Time Streaming Protocol and Real-time Transport Protocol (RTSP/RTP) protocols, and the like. In alternative embodiments of the present disclosure, other communications software and transfer protocols may also be used, for example, Internetwork Packet Exchange (IPX), User Datagram Protocol (UDP), or the like. In some embodiments, computer 920 includes one or more Xeon microprocessors from Intel as processor(s) 960. Further, in one embodiment, computer 920 includes a UNIX-based operating system. Processor(s) 960 can also include special-purpose processors, such as digital signal processor (DSP) and/or reduced instruction set computer (RISC).

RAM 970 and disk drive 980 are examples of tangible storage media configured to store data such as embodiments of the present disclosure, including executable computer code, human-readable code, or the like. Other types of tangible storage media include floppy disks, removable hard disks, optical storage media such as CD-ROMS, DVDs and bar codes, semiconductor memories such as flash memories, read-only memories (ROMS), battery-backed volatile memories, networked storage devices, and the like. RAM 970 and disk drive 980 may be configured to store the basic programming and data constructs that provide the functionality of the present disclosure.

Software code modules and instructions that provide the functionality of the present disclosure may be stored in RAM 970 and disk drive 980. These software modules may be executed by processor(s) 960. RAM 970 and disk drive 980 may also provide a repository for storing data used in accordance with the present disclosure.

RAM 970 and disk drive 980 may include a number of memories, including a main random-access memory (RAM) for storage of instructions and data during program execution and a read-only memory (ROM) in which fixed non-transitory instructions are stored. RAM 970 and disk drive 980 may include a file storage subsystem providing persistent (non-volatile) storage for program and data files. RAM 970 and disk drive 980 may also include removable storage systems, such as removable flash memory.

Bus subsystem 990 provides a mechanism for letting the various components and subsystems of computer 920 communicate with each other as intended. Although bus subsystem 990 is shown schematically as a single bus, alternative embodiments of the bus subsystem may utilize multiple busses.

FIG. 9 is representative of a computer system capable of embodying the present disclosure. It will be readily apparent to one of ordinary skill in the art that many other hardware and software configurations are suitable for use with the present disclosure. For example, the computer may be a desktop, portable, rack-mounted, or tablet configuration. Additionally, the computer may be a series of networked computers. Further, the use of other microprocessors are contemplated, such as Pentium™ or Itanium™ microprocessors, Opteron™ or AthlonXP™ microprocessors from Advanced Micro Devices, Inc., and the like. Further, other types of operating systems are contemplated, such as Windows®, WindowsXP®, WindowsNT®, or the like from Microsoft Corporation, Solaris from Sun Microsystems, LINUX, UNIX, and the like. In still other embodiments, the techniques described above may be implemented upon a chip or an auxiliary processing board.

Various embodiments of the present disclosure can be implemented in the form of logic in software, hardware, or a combination of both. The logic may be stored in a computer-readable or machine-readable non-transitory storage medium as a set of instructions adapted to direct a processor of a computer system to perform a set of steps disclosed in embodiments of the present disclosure. The logic may form part of a computer program product adapted to direct an information-processing device to perform a set of steps disclosed in embodiments of the present disclosure. Based on the disclosure and teachings provided herein, a person of ordinary skill in the art will appreciate other ways and/or methods to implement the present disclosure.

The data structures and code described herein may be partially or fully stored on a computer-readable storage medium and/or a hardware module and/or hardware apparatus. A computer-readable storage medium includes, but is not limited to, volatile memory, non-volatile memory, magnetic and optical storage devices, such as disk drives, magnetic tape, CDs (compact discs), DVDs (digital versatile discs or digital video discs), or other media, now known or later developed, that are capable of storing code and/or data. Hardware modules or apparatuses described herein include, but are not limited to, application-specific integrated circuits (ASICs), field-programmable gate arrays (FPGAs), dedicated or shared processors, and/or other hardware modules or apparatuses now known or later developed.

The methods and processes described herein may be partially or fully embodied as code and/or data stored in a computer-readable storage medium or device, so that when a computer system reads and executes the code and/or data, the computer system performs the associated methods and processes. The methods and processes may also be partially or fully embodied in hardware modules or apparatuses, so that when the hardware modules or apparatuses are activated, they perform the associated methods and processes.

The methods and processes disclosed herein may be embodied using a combination of code, data, and hardware modules or apparatuses.

Certain embodiments have been described. However, various modifications to these embodiments are possible, and the principles presented herein may be applied to other embodiments as well. In addition, the various components and/or method steps/blocks may be implemented in arrangements other than those specifically disclosed without departing from the scope of the claims. Other embodiments and modifications will occur readily to those of ordinary skill in the art in view of these teachings. Therefore, the following claims are intended to cover all such embodiments and modifications when viewed in conjunction with the above specification and accompanying drawings.

What is claimed is:

1. A signal emitting system, comprising:
a signal emitter, characterized by an admittance that increases with signal frequency, configured to emit an output signal based upon an amplified signal;
an amplifier coupled to the signal emitter, the amplifier configured to:
receive a dynamically conditioned source signal;
generate the amplified signal based upon the dynamically conditioned source signal; and
transmit the amplified signal to the signal emitter; and
a processor coupled to the amplifier and configured to receive a source signal and to generate the dynamically conditioned source signal to the amplifier, the processor comprising:
a frequency transform block configured to transform the source signal to a reconstructable frequency domain representation, wherein the reconstructable frequency domain representation comprises a plurality of frequency bins;
a spectrum-to-voltage transfer function block configured to convert the reconstructable frequency domain representation to a voltage representation;
an admittance characteristic block configured to convert the voltage representation to a current spectrum;
a parameter extraction block configured to determine a breakdown frequency bin index and a roll-off factor, wherein the breakdown frequency bin index is the highest frequency bin index where a cumulated current does not exceed a current limit, and the roll-off factor is used to exponentially attenuate the reconstructable frequency domain representation, wherein the roll-off factor is a dynamically determined number ranging from 0 to 1, iteratively determined such that an overall current is under the current limit;
a dynamic conditioning filter block configured to:
construct a conditioning gain vector for the plurality of frequency bins, wherein the conditioning gain vector comprises a flat-band portion of unity gain and a roll-off portion of decaying gain, wherein the flat-band portion comprises frequency bins having bin indices below a flat-band bin index based on the breakdown frequency bin index, and the roll-off portion comprises frequency bins with bin indices above the flat-band bin index; and
apply the conditioning gain vector to the reconstructable frequency domain representation to produce a conditioned frequency domain representation;
an inverse transform block configured to inversely transform the conditioned frequency domain representation to an intermediate time-domain signal; and
a post-processing block configured to apply gradient control to the intermediate time-domain signal to limit differences between consecutive samples of the intermediate time-domain signal to produce the dynamically conditioned source signal, and send the dynamically conditioned source signal to the amplifier.

2. The signal emitting system of claim 1, wherein the parameter extraction block is further configured to use a binary search to iteratively determine the roll-off factor, and wherein a gain of the first bin in the roll-off portion is reduced by the roll-off factor, and gains in the remaining bins in the roll-off portion are reduced by exponents of the roll-off factor.

3. The signal emitting system of claim 1, wherein the signal emitter is a piezo speaker and the output signal is an acoustic signal.

4. The signal emitting system of claim 1, wherein the reconstructable frequency domain representation is selected from the group consisting of fast Fourier transform (FFT), discrete Fourier transform (DFT), modified discrete cosine transform (MDCT), modified discrete sine transform (MDST), constant-Q transform (CQT), and variable-Q transform (VQT) using a filter channel distribution according to equivalent rectangular bandwidths (ERB) or Bark scale.

5. The signal emitting system of claim 1, wherein the current spectrum is modified by an inflation factor greater than one.

6. The signal emitting system of claim 1, wherein the post-processing block is configured to determine a difference threshold for gradient control based on characteristics of the source signal and intermediate signal including crest factor and at least one of mean, standard deviation, root-mean-square, maximum magnitude, average magnitude, crest factor, spectral centroid, and spectral spread.

* * * * *